(12) United States Patent
Bergmann et al.

(10) Patent No.: US 8,546,787 B2
(45) Date of Patent: Oct. 1, 2013

(54) GROUP III NITRIDE BASED QUANTUM WELL LIGHT EMITTING DEVICE STRUCTURES WITH AN INDIUM CONTAINING CAPPING STRUCTURE

(75) Inventors: Michael John Bergmann, Chapel Hill, NC (US); David Todd Emerson, Durham, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 13/250,715

(22) Filed: Sep. 30, 2011

(65) Prior Publication Data

US 2012/0018701 A1    Jan. 26, 2012

Related U.S. Application Data

(60) Continuation of application No. 12/698,658, filed on Feb. 2, 2010, now Pat. No. 8,044,384, which is a continuation of application No. 10/899,791, filed on Jul. 27, 2004, now Pat. No. 7,692,182, which is a continuation-in-part of application No. 10/140,796, filed on May 7, 2002, now Pat. No. 6,958,497, said application No. 12/698,658 is a continuation-in-part of application No. 11/875,353, filed on Oct. 19, 2007, now Pat. No. 8,227,268, which is a division of application No. 10/963,666, filed on Oct. 13, 2004, now Pat. No. 7,312,474, which is a division of application No. 10/140,796, filed on May 7, 2002, now Pat. No. 6,958,497.

(60) Provisional application No. 60/294,445, filed on May 30, 2001, provisional application No. 60/294,308, filed on May 30, 2001, provisional application No. 60/294,378, filed on May 30, 2001.

(51) Int. Cl.
*H01L 31/04*    (2006.01)

(52) U.S. Cl.
USPC    257/13; 257/15; 257/E33.027; 257/E33.028; 438/57

(58) Field of Classification Search
USPC ......... 257/13–15, E33.027, E33.028; 438/47
See application file for complete search history.

(56) References Cited

U.S. PATENT DOCUMENTS

| | | | |
|---|---|---|---|
| 5,294,833 A | 3/1994 | Schetzina | 257/741 |
| 5,351,255 A | 9/1994 | Schetzina | 372/45 |

(Continued)

FOREIGN PATENT DOCUMENTS

| | | |
|---|---|---|
| EP | 0 881 666 A2 | 5/1998 |
| EP | 0 881 666 A2 | 12/1998 |

(Continued)

OTHER PUBLICATIONS

Japanese Office Action Corresponding to Japanese Patent Application No. 2009-184910; Date of Issued: Sep. 28, 2011; JP Text, 4 pages, English Translation thereof, 6 pages.

(Continued)

*Primary Examiner* — Allan R Wilson
(74) *Attorney, Agent, or Firm* — Myers Bigel Sibley & Sajovec

(57) ABSTRACT

Group III nitride based light emitting devices and methods of fabricating Group III nitride based light emitting devices are provided. The emitting devices include an n-type Group III nitride layer, a Group III nitride based active region on the n-type Group III nitride layer and comprising at least one quantum well structure, a Group III nitride layer including indium on the active region, a p-type Group III nitride layer including aluminum on the Group III nitride layer including indium, a first contact on the n-type Group III nitride layer and a second contact on the p-type Group III nitride layer. The Group III nitride layer including indium may also include aluminum.

9 Claims, 4 Drawing Sheets

(56) References Cited

U.S. PATENT DOCUMENTS

| | | | |
|---|---|---|---|
| 5,366,927 A | 11/1994 | Schetzina | 438/603 |
| 5,393,993 A | 2/1995 | Edmond et al. | 257/77 |
| 5,409,859 A | 4/1995 | Glass et al. | 438/523 |
| 5,523,589 A | 6/1996 | Edmond et al. | 257/77 |
| 5,585,648 A | 12/1996 | Tischler | 257/77 |
| 5,661,074 A | 8/1997 | Tischler | 438/32 |
| 5,670,798 A | 9/1997 | Schetzina | 257/96 |
| 5,679,152 A | 10/1997 | Tischler et al. | 117/97 |
| 5,679,965 A | 10/1997 | Schetzina | 257/103 |
| 5,684,309 A | 11/1997 | McIntosh et al. | 257/191 |
| 5,744,829 A | 4/1998 | Murasato et al. | |
| 5,766,981 A * | 6/1998 | Thornton et al. | 438/36 |
| 5,771,256 A | 6/1998 | Bhat | 372/45.01 |
| 5,777,350 A | 7/1998 | Nakamura et al. | 257/96 |
| 5,818,072 A | 10/1998 | Schetzina | 257/78 |
| 5,874,747 A | 2/1999 | Redwing et al. | 257/77 |
| 6,046,464 A | 4/2000 | Schetzina | 257/96 |
| 6,060,335 A | 5/2000 | Rennie et al. | |
| 6,133,589 A | 10/2000 | Krames et al. | 257/103 |
| 6,150,672 A | 11/2000 | Kaneko | 257/94 |
| 6,153,010 A | 11/2000 | Kiyoku et al. | 117/95 |
| 6,153,894 A | 11/2000 | Udagawa | 257/96 |
| 6,156,581 A | 12/2000 | Vaudo et al. | 438/46 |
| 6,162,656 A | 12/2000 | Kunisato et al. | |
| 6,165,812 A * | 12/2000 | Ishibashi et al. | 438/46 |
| 6,172,382 B1 | 1/2001 | Nagahama et al. | |
| 6,201,262 B1 | 3/2001 | Edmond et al. | 257/77 |
| 6,238,945 B1 | 5/2001 | Kaneko | 438/46 |
| 6,337,493 B1 | 1/2002 | Tanizawa et al. | 257/79 |
| 6,407,407 B1 * | 6/2002 | Johnson et al. | 257/18 |
| 6,410,939 B1 | 6/2002 | Koide et al. | |
| 6,447,604 B1 | 9/2002 | Flynn et al. | |
| 6,452,214 B2 | 9/2002 | Kaneyama et al. | |
| 6,459,100 B1 | 10/2002 | Doverspike et al. | 257/97 |
| 6,576,933 B2 | 6/2003 | Sugawara et al. | |
| 6,586,762 B2 | 7/2003 | Kozaki | |
| 6,590,234 B2 | 7/2003 | Kim et al. | |
| 6,608,330 B1 | 8/2003 | Yamada | |
| 6,664,560 B2 | 12/2003 | Emerson et al. | 257/14 |
| 6,717,185 B2 | 4/2004 | Edmond et al. | 257/97 |
| 6,734,033 B2 | 5/2004 | Emerson et al. | 438/29 |
| 6,791,119 B2 | 9/2004 | Slater et al. | |
| 6,794,684 B2 | 9/2004 | Slater et al. | |
| 6,821,800 B2 | 11/2004 | Koide et al. | |
| 6,833,564 B2 | 12/2004 | Shen et al. | |
| 6,891,268 B2 | 5/2005 | Tomiya et al. | |
| 6,943,381 B2 | 9/2005 | Gardner et al. | |
| 6,958,497 B2 | 10/2005 | Emerson et al. | |
| 7,279,717 B2 | 10/2007 | Yamada | |
| 7,557,380 B2 | 7/2009 | Haberern et al. | |
| 8,258,529 B2 * | 9/2012 | Konno et al. | 257/98 |
| 2002/0053676 A1 | 5/2002 | Kozaki | 257/88 |
| 2002/0056836 A1 | 5/2002 | Sawazaki et al. | 257/13 |
| 2002/0125492 A1 * | 9/2002 | Shakuda | 257/94 |
| 2002/0195606 A1 | 12/2002 | Edmond et al. | |
| 2003/0006418 A1 | 1/2003 | Emerson et al. | |
| 2003/0020061 A1 | 1/2003 | Emerson et al. | |
| 2003/0085409 A1 | 5/2003 | Shen et al. | |
| 2003/0118066 A1 | 6/2003 | Bour et al. | |
| 2003/0153112 A1 | 8/2003 | Watanabe et al. | |
| 2004/0012011 A1 | 1/2004 | Tomiya et al. | |
| 2005/0056824 A1 | 3/2005 | Bergmann et al. | |
| 2006/0002442 A1 | 1/2006 | Haberern et al. | |
| 2006/0046328 A1 | 3/2006 | Raffetto et al. | |
| 2006/0186418 A1 | 8/2006 | Edmond et al. | |
| 2007/0018198 A1 | 1/2007 | Brandes et al. | |
| 2008/0258130 A1 | 10/2008 | Bergmann et al. | |
| 2009/0283746 A1 | 11/2009 | Chua et al. | |

FOREIGN PATENT DOCUMENTS

| | | |
|---|---|---|
| EP | 1063711 | 12/2000 |
| EP | 1063711 A1 | 12/2000 |
| EP | 1189289 | 3/2002 |
| EP | 1189289 A1 | 3/2002 |
| EP | 1221723 A2 | 7/2002 |
| EP | 1 313 187 A1 | 5/2003 |
| EP | 1313187 A1 | 5/2003 |
| JP | S6417484 A | 1/1989 |
| JP | 6268257 | 9/1994 |
| JP | 6268257 A | 9/1994 |
| JP | 07-162038 | 6/1995 |
| JP | 7162038 A | 6/1995 |
| JP | 07-176826 | 7/1995 |
| JP | 7176826 A | 7/1995 |
| JP | 08-023124 | 1/1996 |
| JP | 8023124 A | 1/1996 |
| JP | 08-070139 | 3/1996 |
| JP | 8070139 A | 3/1996 |
| JP | 08-162671 | 6/1996 |
| JP | 8162671 A | 6/1996 |
| JP | 08-274414 | 10/1996 |
| JP | 8274414 A | 10/1996 |
| JP | 8-316585 A | 11/1996 |
| JP | 08-330630 | 12/1996 |
| JP | 8330630 A | 12/1996 |
| JP | 09-148678 | 6/1997 |
| JP | 09-153642 | 6/1997 |
| JP | 9148678 A | 6/1997 |
| JP | 9153642 A | 6/1997 |
| JP | 9162444 | 6/1997 |
| JP | 9162444 A | 6/1997 |
| JP | 9219556 | 8/1997 |
| JP | 9219556 A | 8/1997 |
| JP | 9266326 A | 10/1997 |
| JP | H09266326 A | 10/1997 |
| JP | 9-331116 A | 12/1997 |
| JP | 10012969 | 1/1998 |
| JP | 10012969 A | 1/1998 |
| JP | 10-041581 | 2/1998 |
| JP | 10041581 A | 2/1998 |
| JP | 10-065271 | 3/1998 |
| JP | 10-065271 A | 3/1998 |
| JP | 10-084132 A | 3/1998 |
| JP | 10065271 | 3/1998 |
| JP | 10145000 | 5/1998 |
| JP | 10145000 A | 5/1998 |
| JP | 10145002 | 5/1998 |
| JP | 10145002 A | 5/1998 |
| JP | 10-335757 | 12/1998 |
| JP | 10335757 | 12/1998 |
| JP | 11-040850 A | 2/1999 |
| JP | 11 040850 A | 2/1999 |
| JP | 11040850 | 2/1999 |
| JP | 11040850 A | 2/1999 |
| JP | 11-068159 A | 3/1999 |
| JP | 11074562 | 3/1999 |
| JP | 11074562 A | 3/1999 |
| JP | 11-177175 | 7/1999 |
| JP | 11186659 | 7/1999 |
| JP | 11186659 A | 7/1999 |
| JP | 11-191638 A | 7/1999 |
| JP | 11191638 | 7/1999 |
| JP | 11224972 | 8/1999 |
| JP | 11224972 A | 8/1999 |
| JP | 11238945 | 8/1999 |
| JP | 11238945 A | 8/1999 |
| JP | 11251684 | 9/1999 |
| JP | 11251684 A | 9/1999 |
| JP | 11298090 | 10/1999 |
| JP | 11298090 A | 10/1999 |
| JP | 11-330552 | 11/1999 |
| JP | 11-340573 A | 12/1999 |
| JP | 2000-068594 | 3/2000 |
| JP | 2000-068594 A | 3/2000 |
| JP | 2000091705 A | 3/2000 |
| JP | 2000-150957 A | 5/2000 |
| JP | 200150956 | 5/2000 |
| JP | 2000133883 | 5/2000 |
| JP | 2000133883 A | 5/2000 |
| JP | 2000150956 A | 5/2000 |
| JP | 2000-216432 | 8/2000 |
| JP | 2000-232259 A | 8/2000 |
| JP | 200244072 | 9/2000 |
| JP | 2000244072 A | 9/2000 |

| | | |
|---|---|---|
| JP | 2000307149 A | 11/2000 |
| JP | 2000-349337 A | 12/2000 |
| JP | 2001-148546 A | 5/2001 |
| JP | 2001-168471 | 6/2001 |
| JP | 2001-168471 A | 6/2001 |
| JP | 2001-237457 A | 8/2001 |
| JP | 2000307149 | 1/2002 |
| JP | 2002-374043 A | 12/2002 |
| JP | 2002368343 A | 12/2002 |
| JP | 2003152219 A | 5/2003 |
| JP | 2003-218454 A | 7/2003 |
| JP | 2003298192 A | 10/2003 |
| JP | 2004-186708 A | 7/2004 |
| KR | 2001-0075185 | 8/2001 |
| KR | 1020010077530 A | 8/2001 |
| KR | 1020030097817 A | 12/2003 |
| WO | WO 98/31055 | 7/1998 |
| WO | WO 9831055 A1 | 7/1998 |
| WO | WO 99/05728 | 2/1999 |
| WO | WO 9905728 A1 | 2/1999 |
| WO | WO 99/46822 | 9/1999 |
| WO | WO 9946822 A1 | 9/1999 |
| WO | WO 00/21143 | 4/2000 |
| WO | WO 00/21144 A2 | 4/2000 |
| WO | WO 00/76004 A1 | 12/2000 |
| WO | WO 02/05399 A1 | 1/2002 |
| WO | WO 02/097904 A2 | 12/2002 |
| WO | WO 02/103814 A1 | 12/2002 |

OTHER PUBLICATIONS

Japanese Office Action Corresponding to Japanese Patent Application No. 2009-184911; Date of Issued: Sep. 29, 2011; English Translation, 4 pages.

Japanese Office Action Corresponding to Japanese Patent Application No. 2007-523569; Mailing Date: Apr. 17, 2012; Foreign Text, 2 pages, English Translation Thereof, 3 pages.

Korean Notice of Preliminary Rejection Corresponding to Korean Patent Application No. 10-2011-7021897; Dated: Jul. 27, 2012; Foreign Text, 4 pages, English Translation Thereof, 3 Pages.

Japanese Decision on Rejection Corresponding to Japanese Patent Application No. 2009-184911; Mailing Date: Jun. 29, 2012; Foreign Text, 2 Pages, English Translation Thereof, 4 Pages.

American Heritage Dictionary, Second College Edition, 1982, Houghton Mifflin Company, Boston, MA., p. 867, definition of the English language word "On."

Flynn, J.S., et al., Properties of Delta Doped $Al_{0.25}Ga_{0.75}N$ and GaN Epitaxial Layers, Abstract, Paper #L11.44, Materials Research Society 2002 Fall Symposium, Warrendale, PA, USA.

Kim, K.H., et al., "111-nitride Ultraviolet Light-emitting Diodes with Delta Doping," *Appl. Phys. Lett.*, Jul. 21, 2003, pp. 566-568, vol. 83, No. 3.

Pan, Y.B., et al., "Reduction of Threading Edge Dislocation Density in n-type GaN by Si Delta-Doping," *Journal of Crystal Growth*, Jan. 15, 2006, pp. 255-258, vol. 286, No. 2.

Sciana, B., et al., "Epitaxial Growth and Characterisation of Silicon Delta-Doped GaAs, AlAs and $Al_xGa1-_xAs$," *Cysi. Res. Technol.*, Aug. 10, 2001, pp. 1145-1154, vol. 36.

Wang, L.S., et al., "Effects of Periodic Delta-doping on the Properties of GaN:Si Films Grown on Si (111) Substrates," *Appl., Phys. Lett.*, Dec. 13, 2004, vol. 85, No. 24.

Zang, K., et al., "The Effect of Periodic Silane Burst on the Properties of GaN on Si (111) Substrates," *Singapore-MIT Alliance (SMA)*, Advanced Materials for Micro- and Nano-Systems (AMMNS), File No. AMMNS004.pdf, available in DSpace@MIT on Dec. 9, 2004, issued Jan. 2005.

KIPO's Preliminary Rejection in corresponding Korean Patent Application No. 10-2009-7022150 (3 pages w/2 page translation).

EPO Extended Search Report in corresponding EPO Application No. 10180319.5; Nov. 29, 2010, (6 pages).

Japanese Office Action and English Translation (5 pages), corresponding Japanese Application No. 2007-523569; May 24, 2011.

European Search Report corresponding to EP 03 07 8515; mailed on Feb. 2, 2004.

International Search Report for PCT/US 02/16407; Date of Mailing Nov. 13, 2002.

Notification of Transmittal of the International Search Report and The Written Opinion of the International Searching Authority, or the Declaration, corresponding to PCT/US2005/022597, mailed Feb. 15, 2006.

Korean Non-Final Rejection and English Translation (8pages) corresponding to Korean Application No. 10-2008-7026427; Jan. 23, 2009.

Korean Non-Final Rejection and English Translation (12 pages) corresponding to Korean Application No. 10-2003-7012710, Facsimile Date: Sep. 21, 2008.

Partial European Search Report (6 pages) corresponding to European Application No. 09157557.1; Dated: May 28, 2009.

Partial European Search Report (6 pages) corresponding to European Application No. 09157557; Dated May 28, 2009.

Taiwanese Office Action Corresponding to Taiwan Patent Application No. 094122647; Issuance Date: Feb. 7, 2012; Taiwanese Text, 7 pages, English Translation Thereof, 5 pages.

Japanese Office Action Corresponding to Japanese Patent Application No. 2012-000057; Mailing Date: Oct. 9, 2012; Foreign Text, 3 Pages, English Translation Thereof, 4 Pages.

Japanese Office Action Corresponding to Japanese Patent Application No. 2012-000065; Mailing Date: Oct. 26, 2012; Foreign Text, 3 Pages, English Translation Thereof, 4 Pages.

Korean Notice of Preliminary Rejection Corresponding to Korean Patent Application No. 10-2012-7003236; Mailing Date: Mar. 28, 2013; English Translation, 2 Pages.

Japanese Patent Office Appeal Board Questioning Corresponding to Japanese Patent Application No. 2009-184911; Mailing Date: Jan. 18, 2013; English Translation, 3 Pages Korean Notice of Preliminary Rejection Corresponding to Korean Patent Application No, 10-2013-7005591; Mailing Date: Jun. 18, 2013; Foreign Text, 1 Page, Foreign Text, English Translation Thereof, 5 Pages.

Japanese Office Action Corresponding to Japanese Patent Application No. 2011-182184; Mailing Date: Jul. 2, 2013; Foreign Text, 2 Pages, English Translation Thereof, 2 Pages.

Shatalov, M. "Deep Ultraviolet Light-Emitting Diodes Using Quaternary AllnGaN Multiple Quantum Wells," *IEEE Journal on Selected Topics in Quantum Electronics*, vol. 8., No. 2, pp. 302-309 (2002). Mar./Apr. 2002.

\* cited by examiner

GROUP III NITRIDE BASED QUANTUM WELL LIGHT EMITTING DEVICE STRUCTURES WITH AN INDIUM CONTAINING CAPPING STRUCTURE

CROSS-REFERENCE TO RELATED APPLICATIONS

This application is a continuation of U.S. patent application Ser. No. 12/698,658, filed Feb. 2, 2010 now U.S. Pat. No. 8,044,384, entitled GROUP III NITRIDE BASED QUANTUM WELL LIGHT EMITTING DEVICE STRUCTURES WITH AN INDIUM CONTAINING CAPPING STRUCTURE. U.S. patent application Ser. No. 12/698,658 is a continuation of U.S. patent application Ser. No. 10/899,791 filed Jul. 27, 2004 now U.S. Pat. No. 7,692,182 entitled GROUP III NITRIDE BASED QUANTUM WELL LIGHT EMITTING DEVICE STRUCTURES WITH AN INDIUM CONTAINING CAPPING STRUCTURE, which is a continuation-in-part of U.S. patent application Ser. No. 10/140,796 filed May 7, 2002 now U.S. Pat. No. 6,958,497 entitled GROUP III NITRIDE BASED LIGHT EMITTING DIODE STRUCTURES WITH A QUANTUM WELL AND SUPERLATTICE, GROUP III NITRIDE BASED QUANTUM WELL STRUCTURES AND GROUP III NITRIDE BASED SUPERLATTICE STRUCTURES which claims the benefit of, and priority from, Provisional Application Ser. No. 60/294,445, filed May 30, 2001 entitled MULTI-QUANTUM WELL LIGHT EMITTING DIODE STRUCTURE, Provisional Application Ser. No. 60/294,308, filed May 30, 2001 entitled LIGHT EMITTING DIODE STRUCTURE WITH SUPERLATTICE STRUCTURE and Provisional Application Ser. No. 60/294,378, filed May 30, 2001 entitled LIGHT EMITTING DIODE STRUCTURE WITH MULTI-QUANTUM WELL AND SUPERLATTICE STRUCTURE. U.S. patent application Ser. No. 12/698,658 is also a continuation-in-part of U.S. patent application Ser. No. 11/875,353, filed Oct. 19, 2007 now U.S. Pat. No. 8,227,268, which is a divisional of U.S. patent application Ser. No. 10/963,666, filed Oct. 13, 2004 now U.S. Pat. No. 7,312,474, which is a divisional of U.S. patent application Ser. No. 10/140,796 filed May 7, 2002 now U.S. Pat. No. 6,958,497, which claims the benefit of, and priority from, Provisional Application Ser. No. 60/294,445, filed May 30, 2001, Provisional Application Ser. No. 60/294,308, filed May 30, 2001, and Provisional Application Ser. No. 60/294,378, filed May 30, 2001. The disclosures of all of the above-referenced applications are hereby incorporated herein by reference in their entireties as if set forth fully herein.

FIELD OF THE INVENTION

This invention relates to microelectronic devices and fabrication methods therefor, and more particularly to structures which may be utilized in Group III nitride semiconductor devices, such as light emitting diodes (LEDs).

BACKGROUND OF THE INVENTION

Light emitting diodes are widely used in consumer and commercial applications. As is well known to those having skill in the art, a light emitting diode generally includes a diode region on a microelectronic substrate. The microelectronic substrate may comprise, for example, gallium arsenide, gallium phosphide, alloys thereof, silicon carbide and/or sapphire. Continued developments in LEDs have resulted in highly efficient and mechanically robust light sources that can cover the visible spectrum and beyond. These attributes, coupled with the potentially long service life of solid state devices, may enable a variety of new display applications, and may place LEDs in a position to compete with the well entrenched incandescent lamp.

One difficulty in fabricating Group III nitride based LEDs, such as gallium nitride based LEDs, has been with the fabrication of high quality gallium nitride. Typically, gallium nitride LEDs have been fabricated on sapphire or silicon carbide substrates. Such substrates may result in mismatches between the crystal lattice of the substrate and the gallium nitride. Various techniques have been employed to overcome potential problems with the growth of gallium nitride on sapphire and/or silicon carbide. For example, aluminum nitride (AlN) may be utilized as a buffer between a silicon carbide substrate and a Group III active layer, particularly a gallium nitride active layer. Typically, however, aluminum nitride is insulating rather than conductive. Thus, structures with aluminum nitride buffer layers typically require shorting contacts that bypass the aluminum nitride buffer to electrically link the conductive silicon carbide substrate to the Group III nitride active layer.

Alternatively, conductive buffer layer materials such as gallium nitride (GaN), aluminum gallium nitride (AlGaN), or combinations of gallium nitride and aluminum gallium nitride may allow for elimination of the shorting contacts typically utilized with AlN buffer layers. Typically, eliminating the shorting contact reduces the epitaxial layer thickness, decreases the number of fabrication steps required to produce devices, reduces the overall chip size, and/or increases the device efficiency. Accordingly, Group III nitride devices may be produced at lower cost with a higher performance. Nevertheless, although these conductive buffer materials offer these advantages, their crystal lattice match with silicon carbide is less satisfactory than is that of aluminum nitride.

The above described difficulties in providing high quality gallium nitride may result in reduced efficiency the device. Attempts to improve the output of Group III nitride based devices have included differing configurations of the active regions of the devices. Such attempts have, for example, included the use of single and/or double heterostructure active regions. Similarly, quantum well devices with one or more Group III nitride quantum wells have also been described. While such attempts have improved the efficiency of Group III based devices, further improvements may still be achieved.

SUMMARY OF THE INVENTION

Some embodiments of the present invention provide Group III nitride based light emitting devices and methods of fabricating Group III nitride based light emitting devices that include an n-type Group III nitride layer, a Group III nitride based active region on the n-type Group III nitride layer and including at least one quantum well structure, a Group III nitride layer including indium on the active region, a p-type Group III nitride layer including aluminum on the Group III nitride layer including indium, a first contact on the n-type Group III nitride layer and a second contact on the p-type Group III nitride layer.

In further embodiments of the present invention, the Group III nitride layer including indium also includes aluminum. For example, the Group III nitride layer including indium may include InAlGaN. The Group III nitride layer including indium may also include InGaN. The Group III nitride layer including indium may be from about 20 to about 320 Å thick.

In particular embodiments of the present invention, the Group III nitride layer including indium includes a layer of InAlGaN having a higher Al composition in a region distal from the active region than is present in a region proximate the active region. In some embodiments, the InAlGaN layer may be continuously graded. In other embodiments, the InAlGaN layer may include a plurality of InAlGaN layers having different Al and/or In compositions.

In further embodiments of the present invention, the Group III nitride layer including indium includes a first layer of $In_xAl_yGa_{1-x-y}N$, where $0<x\leq0.2$ and $0\leq y\leq0.4$ and a second layer of $In_wAl_zGa_{1-w-z}N$, where $0<w\leq0.2$ and $y\leq z<1$. The first layer may have a thickness of from about 10 to about 200 Å and the second layer may have a thickness of from about 10 to about 120 Å. In particular embodiments, the first layer has a thickness of about 80 Å, x=0.1 and y=0.25 and the second layer has a thickness of about 30 Å, w=0.05 and z=0.55.

In additional embodiments of the present invention, the light emitting devices further include a p-type Group III nitride layer disposed between the second contact and the p-type Group III nitride layer including aluminum. The p-type Group III nitride layer disposed between the second contact and the p-type Group III nitride layer including aluminum may also include indium. The p-type Group III nitride layer including aluminum may also include indium.

In certain embodiments of the present invention, the light emitting devices include a silicon carbide substrate disposed between the first contact and the n-type Group III nitride layer.

Some embodiments of the present invention provide light emitting devices and methods of fabricating light emitting devices that include an n-type gallium nitride based layer on a substrate, a gallium nitride based active region on the n-type gallium nitride based layer and include at least one quantum well structure, a gallium nitride based layer including indium on the active region, a p-type gallium nitride based layer including aluminum on the gallium nitride based layer including indium, a first contact on the n-type gallium nitride based layer and a second contact on the p-type gallium nitride based layer.

In particular embodiments of the present invention, the n-type gallium nitride layer includes an n-type AlGaN layer on the substrate and an n-type GaN layer on the n-type AlGaN layer. The gallium nitride based active region may include a plurality of InGaN/GaN quantum wells.

In further embodiments of the present invention, the p-type gallium nitride based layer includes a p-type AlGaN layer on the gallium nitride based layer including indium and a p-type GaN layer on the p-type AlGaN layer. The second contact is on the p-type GaN layer. The gallium nitride based layer including indium may include a first layer of $In_xAl_yGa_{1-x-y}N$, where $0<x\leq0.2$ and $0\leq y\leq0.4$ and a second layer of $In_wAl_zGa_{1-w-z}N$, where $0<w\leq0.2$ and $y\leq z<1$. The first layer may have a thickness of from about 10 to about 200 Å and the second layer may have a thickness of from about 10 to about 120 Å. In particular embodiments of the present invention, the first layer has a thickness of about 80 Å, x=0.1 and y=0.25 and the second layer has a thickness of about 30 Å, w=0.05 and z=0.55.

In still further embodiments of the present invention, the substrate is a silicon carbide substrate and the first contact is on the silicon carbide substrate opposite the n-type AlGaN layer.

BRIEF DESCRIPTION OF THE DRAWINGS

Other features of the present invention will be more readily understood from the following detailed description of specific embodiments thereof when read in conjunction with the accompanying drawings, in which.

DETAILED DESCRIPTION OF EMBODIMENTS

Figure 1:
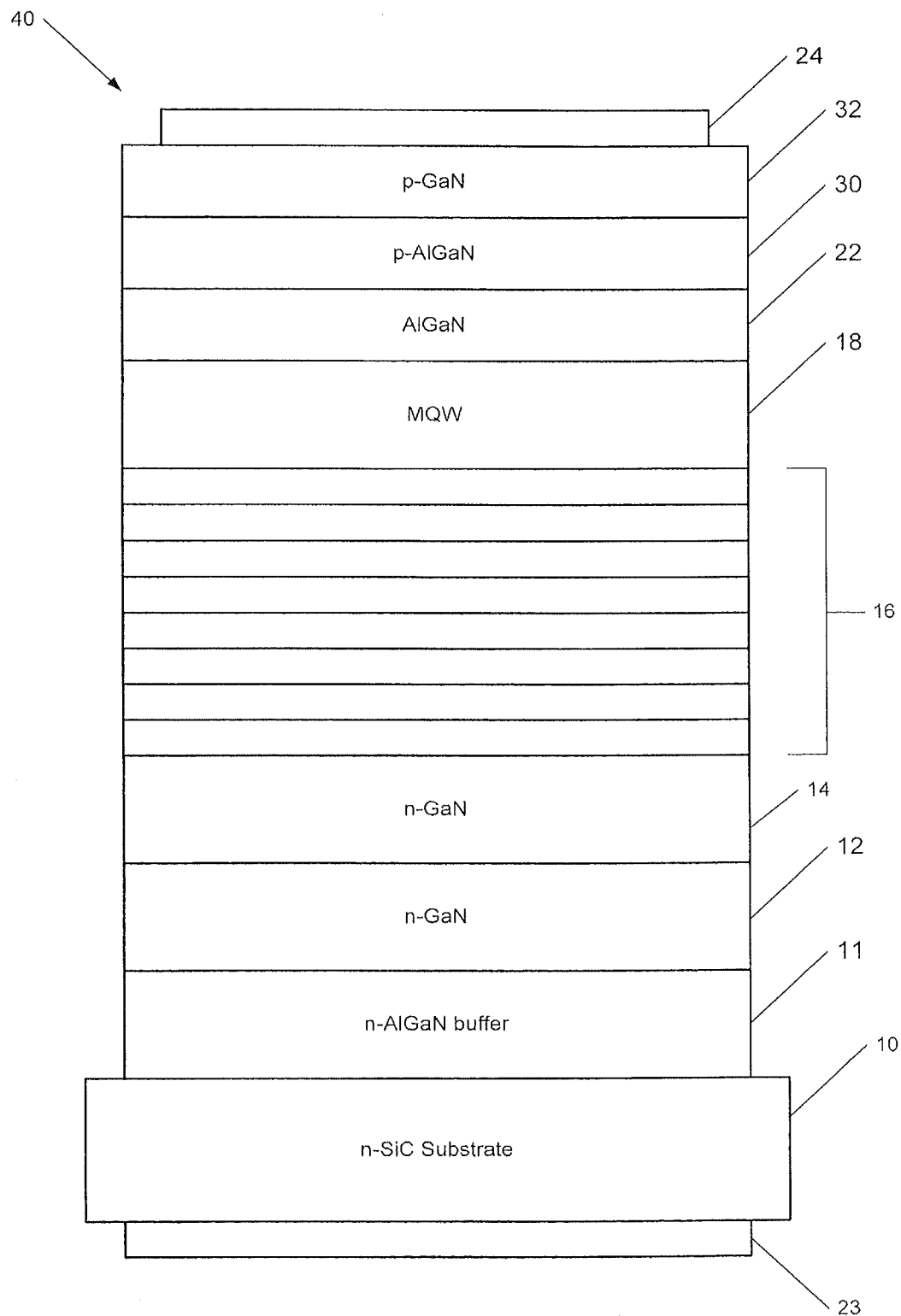
FIG. 1 is a schematic illustration of a Group III nitride light emitting diode incorporating embodiments of the present invention.

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. As used herein the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers refer to like elements throughout the specification.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an etched region illustrated or described as a rectangle will, typically, have rounded or curved features. Thus, the regions illustrated in the figures are schematic in nature and their shapes are not intended to illustrate the precise shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will also be appreciated by those of skill in the art that references to a structure or feature that is disposed "adjacent" another feature may have portions that overlap or underlie the adjacent feature.

Although various embodiments of LEDs disclosed herein include a substrate, it will be understood by those skilled in the art that the crystalline epitaxial growth substrate on which the epitaxial layers comprising an LED are grown may be removed, and the freestanding epitaxial layers may be mounted on a substitute carrier substrate or submount which may have better thermal, electrical, structural and/or optical characteristics than the original substrate. The invention described herein is not limited to structures having crystalline epitaxial growth substrates and may be utilized in connection with structures in which the epitaxial layers have been removed from their original growth substrates and bonded to substitute carrier substrates.

Embodiments of the present invention will be described with reference to FIG. 1 that illustrates a light emitting diode (LED) structure 40. The LED structure 40 of FIG. 1 includes a substrate 10, which is preferably 4H or 6H n-type silicon carbide. Substrate 10 may also comprise sapphire, bulk gallium nitride or another suitable substrate. Also included in the LED structure 40 of FIG. 1 is a layered semiconductor structure comprising gallium nitride-based semiconductor layers on substrate 10. Namely, the LED structure 40 illustrated includes the following layers: a conductive buffer layer 11, a first silicon-doped GaN layer 12, a second silicon doped GaN layer 14, a superlattice structure 16 comprising alternating layers of silicon-doped GaN and/or InGaN, an active region 18, which may be provided by a multi-quantum well structure, an undoped GaN and/or AlGaN layer 22, an AlGaN layer 30 doped with a p-type impurity, and a GaN contact layer 32, also doped with a p-type impurity. The structure further includes an n-type ohmic contact 23 on the substrate 10 and a p-type ohmic contact 24 on the contact layer 32.

Buffer layer 11 is preferably n-type AlGaN. Examples of buffer layers between silicon carbide and group III-nitride materials are provided in U.S. Pat. Nos. 5,393,993 and 5,523,589, and U.S. application Ser. No. 09/154,363 entitled "Vertical Geometry InGaN Light Emitting Diode" assigned to the assignee of the present invention, the disclosures of which are incorporated by reference as if fully set forth herein. Similarly, embodiments of the present invention may also include structures such as those described in U.S. Pat. No. 6,201,262 entitled "Group III Nitride Photonic Devices on Silicon Carbide Substrates With Conductive Buffer Interlay Structure," the disclosure of which is incorporated herein by reference as if set forth fully herein.

GaN layer 12 is preferably between about 500 and 4000 nm thick inclusive and is most preferably about 1500 nm thick. GaN layer 12 may be doped with silicon at a level of about $5\times10^{17}$ to $5\times10^{18}$ cm$^{-3}$. GaN layer 14 is preferably between about 10 and 500 Å thick inclusive, and is most preferably about 80 Å thick. GaN layer 14 may be doped with silicon at a level of less than about $5\times10^{19}$ cm$^{-3}$.

As illustrated in FIG. 1, a superlattice structure 16 according to embodiments of the present invention includes alternating layers of $In_XGa_{1-X}N$ and $In_YGa_{1-Y}N$, wherein X is between 0 and 1 inclusive and X is not equal to Y. Preferably, X=0 and the thickness of each of the alternating layers of InGaN is about 5-40 Å thick inclusive, and the thickness of each of the alternating layers of GaN is about 5-100 Å thick inclusive. In certain embodiments, the GaN layers are about 30 Å thick and the InGaN layers are about 15 Å thick. The superlattice structure 16 may include from about 5 to about 50 periods (where one period equals one repetition each of the $In_XGa_{1-X}N$ and $In_YGa_{1-Y}N$ layers that comprise the superlattice). In one embodiment, the superlattice structure 16 comprises 25 periods. In another embodiment, the superlattice structure 16 comprises 10 periods. The number of periods, however, may be decreased by, for example, increasing the thickness of the respective layers. Thus, for example, doubling the thickness of the layers may be utilized with half the number of periods. Alternatively, the number and thickness of the periods may be independent of one another.

Preferably, the superlattice 16 is doped with an n-type impurity such as silicon at a level of from about $1\times10^{17}$ cm$^{-3}$ to about $5\times10^{19}$ cm$^3$. Such a doping level may be actual doping or average doping of the layers of the superlattice 16. If such doping level is an average doping level, then it may be beneficial to provide doped layers adjacent the superlattice structure 16 that provide the desired average doping which the doping of the adjacent layers is averaged over the adjacent layers and the superlattice structure 16. By providing the superlattice 16 between substrate 10 and active region 18, a better surface may be provided on which to grow InGaN-based active region 18. While not wishing to be bound by any theory of operation, the inventors believe that strain effects in the superlattice structure 16 provide a growth surface that is conducive to the growth of a high-quality InGaN-containing active region. Further, the superlattice is known to influence the operating voltage of the device. Appropriate choice of superlattice thickness and composition parameters can reduce operating voltage and increase optical efficiency.

The superlattice structure 16 may be grown in an atmosphere of nitrogen or other gas, which enables growth of higher-quality InGaN layers in the structure. By growing a silicon-doped InGaN/GaN superlattice on a silicon-doped GaN layer in a nitrogen atmosphere, a structure having improved crystallinity and conductivity with optimized strain may be realized.

In certain embodiments of the present invention, the active region 18 may comprise a single or multi-quantum well structure as well as single or double heterojunction active regions. In particular embodiments of the present invention, the active region 18 comprises a multi-quantum well structure that includes multiple InGaN quantum well layers separated by barrier layers (not shown in FIG. 1).

Layer 22 is provided on active region 18 and is preferably undoped GaN or AlGaN between about 0 and 120 Å thick inclusive. As used herein, undoped refers to a not intentionally doped. Layer 22 is preferably about 35 Å thick. If layer 22 comprises AlGaN, the aluminum percentage in such layer is preferably about 10-30% and most preferably about 24%. The level of aluminum in layer 22 may also be graded in a stepwise or continuously decreasing fashion. Layer 22 may be grown at a higher temperature than the growth temperatures in quantum well region 25 in order to improve the crystal quality of layer 22. Additional layers of undoped GaN or AlGaN may be included in the vicinity of layer 22. For example, LED 1 may include an additional layer of undoped AlGaN about 6-9 Å thick between the active region 18 and the layer 22.

An AlGaN layer 30 doped with a p-type impurity such as magnesium is provided on layer 22. The AlGaN layer 30 may be between about 0 and 300 Å thick inclusive and is preferably about 130 Å thick. A contact layer 32 of p-type GaN is provided on the layer 30 and is preferably about 1800 Å thick. Ohmic contacts 24 and 25 are provided on the p-GaN contact layer 32 and the substrate 10, respectively.

Figure 2:
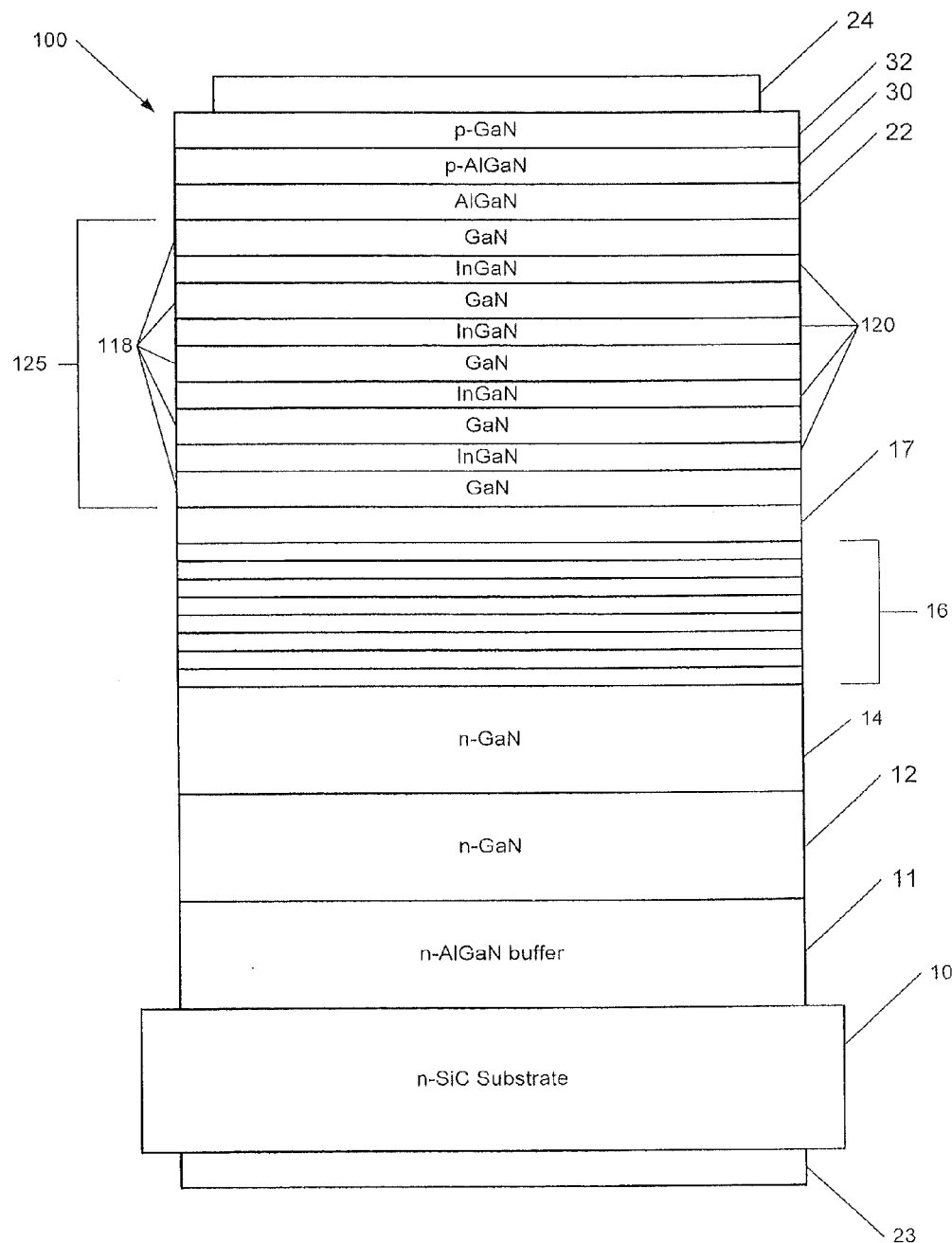
FIG. 2 is a schematic illustration of a Group III nitride light emitting diode incorporating further embodiments of the present invention.

FIG. 2 illustrates further embodiments of the present invention incorporating a multi-quantum well active region. The embodiments of the present invention illustrated in FIG. 2 include a layered semiconductor structure 100 comprising gallium nitride-based semiconductor layers grown on a substrate 10. As described above, the substrate 10 may be SiC, sapphire or bulk gallium nitride. As is illustrated in FIG. 2, LEDs according to particular embodiments of the present invention may include a conductive buffer layer 11, a first silicon-doped GaN layer 12, a second silicon doped GaN layer 14, a superlattice structure 16 comprising alternating layers of silicon-doped GaN and/or InGaN, an active region 125 comprising a multi-quantum well structure, an undoped GaN or AlGaN layer 22, an AlGaN layer 30 doped with a p-type impurity, and a GaN contact layer 32, also doped with a p-type impurity. The LEDs may further include an n-type ohmic contact 23 on the substrate 10 and a p-type ohmic contact 24 on the contact layer 32. In embodiments of the present invention where the substrate 10 is sapphire, the n-type ohmic contact 23 would be provided on n-type GaN layer 12 and/or n-type GaN layer 14.

As described above with reference to FIG. 1, buffer layer 11 is preferably n-type AlGaN. Similarly, GaN layer 12 is preferably between about 500 and 4000 nm thick inclusive and is most preferably about 1500 nm thick. GaN layer 12 may be doped with silicon at a level of about $5 \times 10^{17}$ to $5 \times 10^{18}$ cm$^{-3}$. GaN layer 14 is preferably between about 10 and 500 Å thick inclusive, and is most preferably about 80 Å thick. GaN layer 14 may be doped with silicon at a level of less than about $5 \times 10^{19}$ cm$^{-3}$. The superlattice structure 16 may also be provided as described above with reference to FIG. 1.

The active region 125 comprises a multi-quantum well structure that includes multiple InGaN quantum well layers 120 separated by barrier layers 118. The barrier layers 118 comprise $In_XGa_{1-X}N$ where $0 \leq X < 1$. Preferably the indium composition of the barrier layers 118 is less than that of the quantum well layers 120, so that the barrier layers 118 have a higher bandgap than quantum well layers 120. The barrier layers 118 and quantum well layers 120 may be undoped (i.e. not intentionally doped with an impurity atom such as silicon or magnesium). However, it may be desirable to dope the barrier layers 118 with Si at a level of less than $5 \times 10^{19}$ cm$^{-3}$, particularly if ultraviolet emission is desired.

In further embodiments of the present invention, the barrier layers 118 comprise $Al_XIn_YGa_{1-X-Y}N$ where $0 < X < 1$, $0 \leq Y < 1$ and $X+Y \leq 1$. By including aluminum in the crystal of the barrier layers 118, the barrier layers 118 may be lattice-matched to the quantum well layers 120, thereby providing improved crystalline quality in the quantum well layers 120, which increases the luminescent efficiency of the device.

Figure 3:
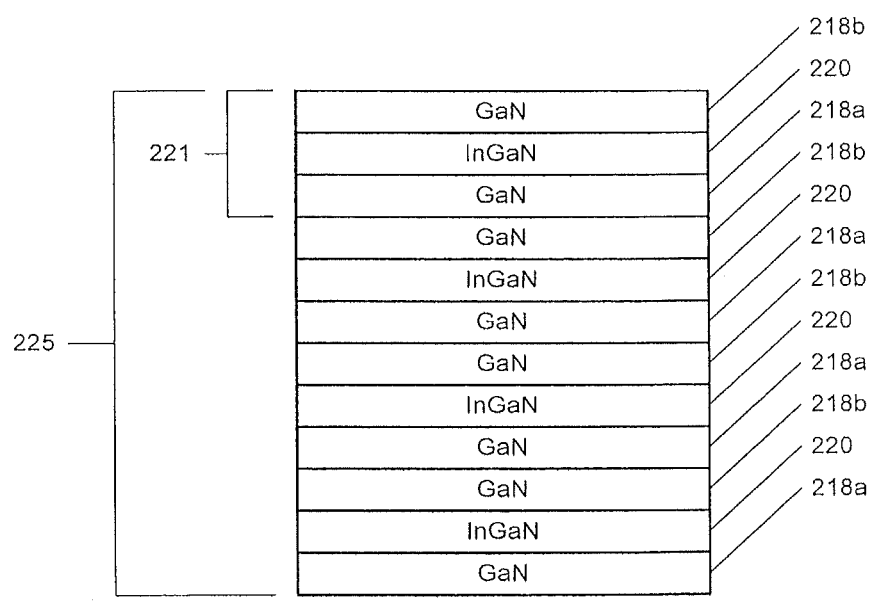
FIG. 3 is a schematic illustration of a quantum well structure and a multi-quantum well structure according to additional embodiments of the present invention.

Referring to FIG. 3, embodiments of the present invention that provide a multi-quantum well structure of a gallium nitride based device are illustrated. The multi-quantum well structure illustrated in FIG. 3 may provide the active region of the LEDs illustrated in FIG. 1 and/or FIG. 2. As seen in FIG. 3, an active region 225 comprises a periodically repeating structure 221 comprising a well support layer 218a having high crystal quality, a quantum well layer 220 and a cap layer 218b that serves as a protective cap layer for the quantum well layer 220. When the structure 221 is grown, the cap layer 218b and the well support layer 218a together form the barrier layer between adjacent quantum wells 220. Preferably, the high quality well support layer 218a is grown at a higher temperature than that used to grow the InGaN quantum well layer 220. In some embodiments of the present invention, the well support layer 218a is grown at a slower growth rate than the cap layer 218b. In other embodiments, lower growth rates may be used during the lower temperature growth process and higher growth rates utilized during the higher temperature growth process. For example, in order to achieve a high quality surface for growing the InGaN quantum well layer 220, the well support layer 218a may be grown at a growth temperature of between about 700 and 900° C. Then, the temperature of the growth chamber is lowered by from about 0 to about 200° C. to permit growth of the high-quality InGaN quantum well layer 220. Then, while the temperature is kept at the lower InGaN growth temperature, the cap layer 218b is grown. In that manner, a multi-quantum well region comprising high quality InGaN layers may be fabricated.

The active regions 125 and 225 of FIGS. 2 and 3 are preferably grown in a nitrogen atmosphere, which may provide increased InGaN crystal quality. The barrier layers 118, the well support layers 218a and/or the cap layers 218b may be between about 50-400 Å thick inclusive. The combined thickness of corresponding ones of the well support layers 218a and the cap layers 218b may be from about 50-400 Å thick inclusive. Preferably, the barrier layers 118 the well support layers 218a and/or the cap layers 218b are greater than about 90 Å thick and most preferably are about 225 Å thick. Also, it is preferred that the well support layers 218a be thicker than the cap layers 218b. Thus, the cap layers 218b are preferably as thin as possible while still reducing the desorption of Indium from or the degradation of the quantum well layers 220. The quantum well layers 120 and 220 may be between about 10-50 Å thick inclusive. Preferably, the quantum well layers 120 and 220 are greater than 20 Å thick and most preferably are about 25 Å thick. The thickness and percentage of indium in the quantum well layers 120 and 220 may be varied to produce light having a desired wavelength. Typically, the percentage of indium in quantum well layers 120 and 220 is about 25-30%, however, depending on the desired wavelength, the percentage of indium has been varied from about 5% to about 50%.

In preferred embodiments of the present invention, the bandgap of the superlattice structure 16 exceeds the bandgap of the quantum well layers 120. This may be achieved by adjusting the average percentage of indium in the superlattice 16. The thickness (or period) of the superlattice layers and the average Indium percentage of the layers should be chosen such that the bandgap of the superlattice structure 16 is greater than the bandgap of the quantum wells 120. By keeping the bandgap of the superlattice 16 higher than the bandgap of the quantum wells 120, unwanted absorption in the device may be minimized and luminescent emission may be maximized. The bandgap of the superlattice structure 16 may be from about 2.95 eV to about 3.35 eV. In a preferred embodiment, the bandgap of the superlattice structure 16 is about 3.15 eV.

In additional embodiments of the present invention, the LED structure illustrated in FIG. 2 includes a spacer layer 17 disposed between the superlattice 16 and the active region 125. The spacer layer 17 preferably comprises undoped GaN. The presence of the optional spacer layer 17 between the doped superlattice 16 and active region 125 may deter silicon impurities from becoming incorporated into the active region 125. This, in turn, may improve the material quality of the active region 125 that provides more consistent device performance and better uniformity. Similarly, a spacer layer may also be provided in the LED structure illustrated in FIG. 1 between the superlattice 16 and the active region 18.

Returning to FIG. 2, the layer 22 may be provided on the active region 125 and is preferably undoped GaN or AlGaN between about 0 and 120 Å thick inclusive. The layer 22 is preferably about 35 Å thick. If the layer 22 comprises AlGaN, the aluminum percentage in such layer is preferably about 10-30% and most preferably about 24%. The level of aluminum in the layer 22 may also be graded in a stepwise or continuously decreasing fashion. The layer 22 may be grown at a higher temperature than the growth temperatures in the active region 125 in order to improve the crystal quality of the layer 22. Additional layers of undoped GaN or AlGaN may be included in the vicinity of layer 22. For example, the LED illustrated in FIG. 2 may include an additional layer of undoped AlGaN about 6-9 Å thick between the active regions 125 and the layer 22.

An AlGaN layer 30 doped with a p-type impurity such as magnesium is provided on layer 22. The AlGaN layer 30 may be between about 0 and 300 Å thick inclusive and is preferably about 130 Å thick. A contact layer 32 of p-type GaN is provided on the layer 30 and is preferably about 1800 Å thick. Ohmic contacts 24 and 25 are provided on the p-GaN contact layer 32 and the substrate 10, respectively. Ohmic contacts 24 and 25 are provided on the p-GaN contact layer 32 and the substrate 10, respectively.

Figure 4:
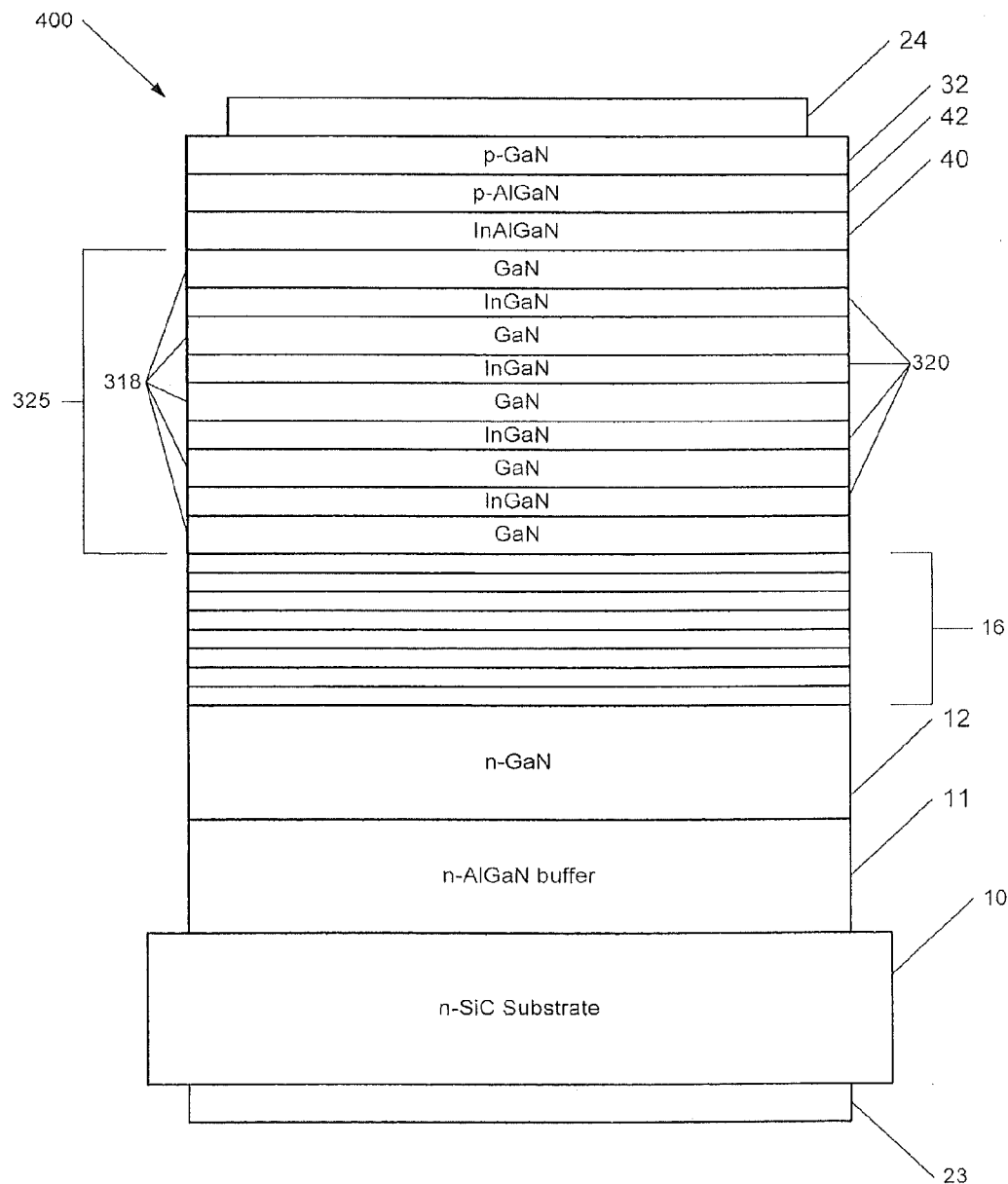
FIG. 4 is a schematic illustration of a Group III nitride light emitting diode incorporating further embodiments of the present invention.

FIG. 4 illustrates further embodiments of the present invention incorporating a Group III-nitride layer incorporating Indium on the active region of the device, For example, an InAlGaN cap structure may be provided. The embodiments of the present invention illustrated in FIG. 4 include a layered semiconductor structure 400 comprising gallium nitride-based semiconductor layers grown on a substrate 10. As described above, the substrate 10 may be SiC, sapphire or bulk gallium nitride. In particular embodiments of the present invention, the substrate 10 is a SiC substrate having a thickness of from about 50 to about 800 μm and in some embodiments, about 100 μm.

As is illustrated in FIG. 4, LEDs according to particular embodiments of the present invention may include a conductive buffer layer 11, a first silicon-doped GaN layer 12, a second silicon doped GaN layer 14, a superlattice structure 16 comprising alternating layers of silicon-doped GaN and/or InGaN, an active region 325 comprising a multi-quantum well structure, an undoped AlInGaN layer 40, an AlGaN layer 30 doped with a p-type impurity, and a GaN contact layer 32, also doped with a p-type impurity. The LEDs may further include an n-type ohmic contact 23 on the substrate 10 and a p-type ohmic contact 24 on the contact layer 32. In embodiments of the present invention where the substrate 10 is sapphire, the n-type ohmic contact 23 would be provided on n-type GaN layer 12 and/or n-type GaN layer 14.

As described above with reference to FIGS. 1 and 2, the buffer layer 11 may be n-type AlGaN. For example, the buffer layer 11 may be AlGaN doped with Si and having a thickness of from about 100 to about 10,000 Å. In certain embodiments the thickness is about 1500 Å. The GaN layer 12 may be doped with Si and may have a thickness of from about 5000 to 50,000 Å thick inclusive and, in particular embodiments, is about 18,000 Å thick. The GaN layer 12 may be doped with silicon at a level of about $5 \times 10^{17}$ to $5 \times 10^{18}$ cm$^{-3}$, The superlattice structure 16 may also be provided as described above with reference to FIG. 1. For example, the superlattice structure 16 may have from 3 to 35 periods of InGaN/GaN. The thickness of the periods may be from about 30 to about 100 Å. In particular embodiments of the present invention, twenty five (25) periods of InGaN/GaN are provided with the thickness of a period of layers being about 70 Å and the thickness of the GaN or InGaN layer being about 15 Å with the other layer making up the remainder.

The active region 325 may include a multi-quantum well structure that includes multiple InGaN quantum well layers 320 separated by barrier layers 318. The barrier layers 318 comprise In$_x$Ga$_{1-x}$N where 0≤X<1. Preferably the indium composition of the barrier layers 318 is less than that of the quantum well layers 320, so that the barrier layers 318 have a higher bandgap than quantum well layers 320. The barrier layers 318 and quantum well layers 320 may be undoped (i.e. not intentionally doped with an impurity atom such as silicon or magnesium). However, it may be desirable to dope the barrier layers 318 with Si at a level of less than $5 \times 10^{19}$ cm$^{-3}$, particularly if ultraviolet emission is desired.

In further embodiments of the present invention, the barrier layers 318 comprise Al$_x$In$_y$Ga$_{1-X-Y}$N where 0<X<1, 0≤Y<1 and X+Y≤1. By including aluminum in the crystal of the barrier layers 318, the barrier layers 318 may be lattice-matched to the quantum well layers 320, thereby allowing improved crystalline quality in the quantum well layers 320, which can increase the luminescent efficiency of the device.

The active region 325 may also be provided as illustrated in FIG. 3 and described above with reference to FIGS. 1 through 3. In particular embodiments of the present invention, the active region 325 includes 3 or more quantum wells and in certain embodiments, eight (8) quantum wells are provided. The thickness of the quantum well structures may be from about 30 to about 250 Å. In particular embodiments of the present invention, the thickness of a quantum well structure may be about 120 Å with the thickness of the well layer being about 25 Å.

The LED structure illustrated in FIG. 4 may also include a spacer layer disposed between the superlattice 16 and the active region 325 as described above.

Returning to FIG. 4, a Group III-nitride capping layer 40 that includes Indium may be provided on the active region 325 and, more specifically, on the quantum well 320 of the active region 325. The Group III-nitride capping layer 40 may include InAlGaN between about 10 and 320 Å thick inclusive. The capping layer 40 may be of uniform composition, multiple layers of different compositions and/or graded composition. In particular embodiments of the present invention, the capping layer 40 includes a first capping layer having a composition of $In_xAl_yGa_{1-x-y}N$, where $0<x\leq0.2$ and $0\leq y\leq0.4$ and has a thickness of from about 10 to about 200 Å and a second capping layer having a composition of $In_wAl_zGa_{1-w-z}N$, where $0<w\leq0.2$ and $y\leq z<1$ and has a thickness of from about 10 to about 120 Å. In certain embodiments of the present invention, the first capping layer has a thickness of about 80 Å, $x=0.1$ and $y=0.25$ and the second capping layer has a thickness of about 30 Å, $w=0.05$ and $z=0.55$. The capping layer 40 may be grown at a higher temperature than the growth temperatures in the active region 325 in order to improve the crystal quality of the layer 40. Additional layers of undoped GaN or AlGaN may be included in the vicinity of layer 40. For example, a thin layer of GaN may be provided between a last quantum well layer and the capping layer 40. The capping layer 40 that includes indium may be more closely lattice matched to the quantum wells of the active region 325 and may provide a transition from the lattice structure of the active region 325 to the lattice structure of the p-type layers. Such a structure may result in increased brightness of the device.

An AlGaN hole injection layer 42 doped with a p-type impurity such as magnesium is provided on the capping layer 40. The AlGaN layer 42 may be between about 50 and 2500 Å thick inclusive and, in particular embodiments, is about 150 Å thick. The AlGaN layer 42 may be of the composition of $Al_xGa_{1-x}N$, where $0\leq x\leq0.4$. In particular embodiments of the present invention, $x=0.23$ for the AlGaN layer 42. The AlGaN layer 42 may be doped with Mg. In some embodiments of the present invention, the layer 42 may also include Indium.

A contact layer 32 of p-type GaN is provided on the layer 42 and may be from about 250 to abut 10,000 Å thick and in some embodiments, about 1500 Å thick. In some embodiments, the contact layer 32 may also include Indium. Ohmic contacts 24 and 25 are provided on the p-GaN contact layer 32 and the substrate 10, respectively. Ohmic contacts 24 and 25 are provided on the p-GaN contact layer 32 and the substrate 10, respectively.

In some embodiments of the present invention, the indium containing capping layer 40 may be provided in light emitting devices as described, for example, in U.S. Provisional Patent Application Ser. No. 60/591,353 entitled "ULTRA-THIN OHMIC CONTACTS FOR P-TYPE NITRIDE LIGHT EMITTING DEVICES" and filed concurrently herewith, U.S. patent application Ser. No. 10/899,793 entitled "LIGHT EMITTING DEVICES HAVING A REFLECTIVE BOND PAD AND METHODS OF FABRICATING LIGHT EMITTING DEVICES HAVING REFLECTIVE BOND PADS" and filed concurrently herewith, U.S. Pat. No. 6,664,560, U.S. patent application Ser. No. 10/881,814 entitled "LIGHT EMITTING DEVICES HAVING CURRENT BLOCKING STRUCTURES AND METHODS OF FABRICATING LIGHT EMITTING DEVICES HAVING CURRENT BLOCKING STRUCTURES," filed Jun. 30, 2004, U.S. Patent Publication No. 2003/0123164 entitled "LIGHT EMITTING DIODES INCLUDING SUBSTRATE MODIFICATIONS FOR LIGHT EXTRACTION AND MANUFACTURING METHODS THEREFOR" and/or in U.S. Patent Publication No. 2003/0168663 entitled "REFLECTIVE OHMIC CONTACTS FOR SILICON CARBIDE INCLUDING A LAYER CONSISTING ESSENTIALLY OF NICKEL, METHODS OF FABRICATING SAME, AND LIGHT EMITTING DEVICES INCLUDING THE SAME," the disclosures of which is incorporated herein as if set forth in its entirety.

Electroluminescence (EL) testing was performed on LED wafers having devices with and without the indium containing capping layer, in particular, an InAlGaN capping layer, as illustrated in FIG. 4. The EL test is an on-wafer test that measures the brightness of LED epitaxial structures. This test is not influenced by the LED fabrication method, chip shaping, or packaging method. Approximately 176 wafers with the structure including the indium containing layer and 615 wafers without the indium containing layer were tested. Both structures were grown continuously on a number of reactors. The reactors were all essentially the same (i.e. none have any special modification for increased brightness, all have been and continue to be suitable for production use). The data from the wafers was binned and shows that the structure with the indium containing layer was approximately 1.15 to 1.25 times brighter than the structure without the indium containing layer.

While embodiments of the present invention have been described with multiple quantum wells, the benefits from the teachings of the present invention may also be achieved in single quantum well structures. Thus, for example, a light emitting diode may be provided with a single occurrence of the structure 221 of FIG. 3 as the active region of the device. Thus, while different numbers of quantum wells may be utilized according to embodiments of the present invention, the number of quantum wells will typically range from 1 to 10 quantum wells.

While embodiments of the present invention have been described with reference to gallium nitride based devices, the teachings and benefits of the present invention may also be provided in other Group III nitrides. Thus, embodiments of the present invention provide Group III nitride based superlattice structures, quantum well structures and/or Group III nitride based light emitting diodes having superlattices and/or quantum wells.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A light emitting diode, comprising:
   an n-type Group III nitride layer;
   a Group III nitride light emitting diode active region on the n-type Group III nitride layer, the light emitting diode active region comprising at least one quantum well structure; and
   an undoped Group III nitride capping layer comprising indium on the light emitting diode active region opposite from the n-type Group III nitride layer, wherein the capping layer is distinct from the light emitting diode active region, and wherein the capping layer is directly on a binary Group III nitride layer.

2. The light emitting diode of claim 1, wherein the capping layer comprising indium comprises a quaternary layer.

3. The light emitting diode of claim 1, wherein the binary Group III nitride layer comprises a barrier layer of the active region.

4. The light emitting diode of claim 1, wherein the binary Group III nitride layer is between the active region and the undoped capping layer.

5. The light emitting diode of claim 1, wherein the undoped Group III nitride capping layer further comprises aluminum.

6. The light emitting diode of claim 1, further comprising:
a p-type Group III nitride layer directly on the undoped Group III nitride capping layer and remote from the active region.

7. The light emitting diode of claim 1, wherein the undoped Group III nitride capping layer provides a transition from a lattice structure of the light emitting diode active region to a lattice structure of a p-type layer thereon.

8. The light emitting diode of claim 1, wherein the undoped Group III nitride capping layer does not provide photon emission due to carrier recombination therein.

9. A light emitting diode, comprising:
an n-type Group III nitride layer;
a Group III nitride light emitting diode active region on the n-type Group III nitride layer, the light emitting diode active region comprising at least one quantum well structure; and
an undoped Group III nitride capping layer comprising indium on the light emitting diode active region opposite from the n-type Group III nitride layer, wherein the capping layer is distinct from the light emitting diode active region, and wherein the capping layer is directly on a quaternary barrier layer of the active region.

\* \* \* \* \*